(12) United States Patent
Hennessy et al.

(10) Patent No.: US 7,286,075 B2
(45) Date of Patent: Oct. 23, 2007

(54) ANALOG TO DIGITAL CONVERTER WITH DITHER

(75) Inventors: Michael Hennessy, Limerick (IE); Christopher Peter Hurrell, Cookham (GB); Colin Gerard Lyden, Baltimore (IE)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 11/273,196

(22) Filed: Nov. 14, 2005

(65) Prior Publication Data

US 2007/0109168 A1    May 17, 2007

(51) Int. Cl.
*H03M 1/12* (2006.01)

(52) U.S. Cl. .................. 341/172; 341/155; 341/144

(58) Field of Classification Search ............ 341/144, 341/155, 172, 122, 120
See application file for complete search history.

(56) References Cited

U.S. PATENT DOCUMENTS

| | | | |
|---|---|---|---|
| 4,831,381 A * | 5/1989 | Hester .................. | 341/172 |
| 5,010,339 A | 4/1991 | Giangano et al. | |
| 5,621,409 A | 4/1997 | Cotter et al. | |
| 5,675,340 A | 10/1997 | Hester | |
| 5,852,415 A | 12/1998 | Cotter et al. | |
| 6,486,806 B1 | 11/2002 | Munoz | |
| 6,747,522 B2 * | 6/2004 | Pietruszynski et al. .................. | 331/177 R |
| 6,784,814 B1 * | 8/2004 | Nair et al. .................. | 341/118 |
| 6,850,181 B1 * | 2/2005 | Tsinker .................. | 341/163 |
| 6,914,550 B2 * | 7/2005 | Cai .................. | 341/155 |
| 7,015,853 B1 * | 3/2006 | Wolff et al. .................. | 341/155 |
| 7,023,372 B1 * | 4/2006 | Singh et al. .................. | 341/155 |
| 7,026,975 B1 * | 4/2006 | Steward et al. .................. | 341/161 |
| 2004/0100397 A1 | 5/2004 | Abdelatty | |

OTHER PUBLICATIONS

International Search Report in PCT/US2006/044122, Feb. 27, 2007.

* cited by examiner

*Primary Examiner*—Peguy JeanPierre
(74) *Attorney, Agent, or Firm*—Wolf, Greenfield & Sacks, P.C.

(57) ABSTRACT

An analog to digital converter is provided comprising an array of capacitors for sampling an input, each capacitor having at least one associated switch for controllably connecting a terminal of the capacitor to a first reference voltage or to a second reference voltage; and a sequence generator for generating a sequence of bits, wherein during sampling of the input onto the array of capacitors an output of the sequence generator is supplied to the switches of a first group of capacitors to control whether a given capacitor within the first group is connected by its associated switch to the first reference voltage or to the second reference voltage.

25 Claims, 3 Drawing Sheets

ANALOG TO DIGITAL CONVERTER WITH DITHER

FIELD OF THE INVENTION

The present invention relates to an apparatus for and a method of applying dither to an analog to digital converter, and to an analog to digital converter including such an apparatus.

BACKGROUND OF THE INVENTION

It is desirable that an analog to digital converter should have a good resolution, but also exhibit good linearity. The resolution of a converter is quoted in the number of bits that it converts. Typical high performance converters exhibit 14 or 18 bit resolution. However a user should also pay attention to other performance metrics of the analog to digital converter, such as integral non-linearity, INL, and differential non-linearity, DNL. The differential non-linearity refers to the relative step sizes of each discrete code produced by the analog to digital converter. In an ideal world, if a ramped input voltage is applied to the analog to digital converter then each transition from one digital code to the next should be equally spaced along the analog ramp. However differential non-linearity errors can result in these transitions becoming non-equally spaced. It can be useful to think of the analog values as being sorted into different digital "bins" and therefore each bin should be of the same size. The differential non-linearity can be expressed in terms of size of the least significant bit. It can be seen, using the DNL descriptions shown in FIG. 2, that converters having a differential non-linearity of greater than −1 LSB (−1LSB<DNL error) are guaranteed to have no missing codes. For optimum DC performance DNL error should be zero on all codes.

Although manufacturers take great care to minimise differential non-linearity, process variations and limitations on the physical accuracy to which devices can be fabricated almost inevitably mean that some DNL errors will remain.

U.S. Pat. No. 5,010,339 discloses an arrangement in which a standard analog to digital converter is associated within an additional external circuit which includes a summer preceding the analog to digital converter. The summer receives the signal to be converted at a first input and an output of a digital to analog converter at a second output. The digital to analog converter is driven so as to add a varying but known voltage to the analog signal prior to conversion. This causes repeated input voltage signals of the same value to be converted in different bins of the analog to digital converter thereby minimising DNL errors due to unequal bin widths. However this circuit increases the complexity of the analog to digital converter, and the additional circuitry could be a source of offset errors and gain errors

SUMMARY OF THE INVENTION

According to a first aspect of the present invention there is provided an analog to digital converter comprising an array of capacitors, each capacitor having at least one associated switch for controllably connecting a first terminal of the capacitor to a first reference voltage or to a second reference voltage; and a sequence generator for generating a sequence of bits, wherein during sampling of the input onto at least one of the capacitors of the array of capacitors or during conversion of the sample into a digital version an output of the sequence generator is supplied to the switches of a first group of capacitors to control whether a given capacitor within the first group is connected to the first reference voltage or to the second reference voltage.

It is thus possible to use capacitors forming part of the analog to digital converter to provide a controlled perturbation to the sampled input. Multiple conversions of substantially the same input value can result in the input value being assigned to different "bins" within the conversion process as a result of different perturbations being applied at each individual sampling point. This gives rise to an improvement in DNL error and significantly reduces the possibility of missing codes, and in well designated converters effectively guarantees that there will be no missing codes.

Advantageously some of the capacitors of the array are used to sample an input signal as well as being involved in its conversion.

Preferably the second group of capacitors are selected from the least significant capacitors within the array of capacitors.

Advantageously a plurality of capacitors having a bit weight substantially in the range of 0.5 to 2 LSB are provided as additional capacitors within the switched capacitor array, and these capacitors constitute the second group of capacitors.

Advantageously the second group of capacitors are an integral part of the capacitor array, although alternatively they may be formed in a sub array connected to the primary array of capacitors via a coupling capacitor.

Advantageously the sequence generator generates a random or pseudorandom sequence for controlling the switches of the second group of capacitors. The use of a random or pseudorandom sequence helps avoid systematic errors which might, in a worst case scenario, cause some codes to become missing for brief periods of time.

Advantageously an arithmetic unit is provided which receives the bit sequence from the sequence generator and therefore has knowledge of the size of the perturbation applied to the input signal. The arithmetic unit also receives the converted code from the switched capacitor array and it applies a compensation to the code from the switched capacitor array to take account of the perturbation which was applied.

According to a second aspect of the present invention there is provided an analog to digital converter comprising:
  a switched capacitor array for use in sampling an analog value and for converting the analog value to a digital value; and
  a switched capacitor digital to analog converter responsive to a control word; wherein, after sampling an input signal onto the switched capacitor array the switched capacitor digital to analog converter is operated to make a known perturbation to the charge stored on the switched capacitor array.

Preferably the switched capacitor digital to analog converter is an integral part of the switched capacitor array.

According to a third aspect of the present invention there is provided a method of applying dither to an analog to digital converter wherein the converter comprises an array of capacitors, each capacitor having at least one associated switch for controllably connecting a terminal of the capacitor to a first reference voltage or to a second reference voltage; wherein during sampling of an input onto at least one capacitor of the array of capacitors or during conversion of the sample a perturbation control word is supplied to the switches of a first group of capacitors to control whether a given capacitor within the first group is connected by its associated switch to the first reference voltage or to the second reference voltage.

According to a fourth aspect of the present invention there is provided a method of adding dither to an input signal to be digitised by an analog to digital converter, wherein the analog to digital converter comprises a switched capacitor array for use in sampling an input value and for converting the input to a digital value, and the analog to digital converter further comprises a switched capacitor digital to analog converter responsive to a control word, wherein after sampling an input signal onto the switched capacitor array the switched capacitor digital to analog converter is operated to make a known perturbation to the charge stored on the switched capacitor array or to a voltage occurring on the array.

BRIEF DESCRIPTION OF THE FIGURES

Embodiments of the present invention will further be described, by way of non-limiting example, with reference to the accompanying drawings, in which.

DESCRIPTION OF PREFERRED
EMBODIMENTS OF THE PRESENT
INVENTION

Figure 1:
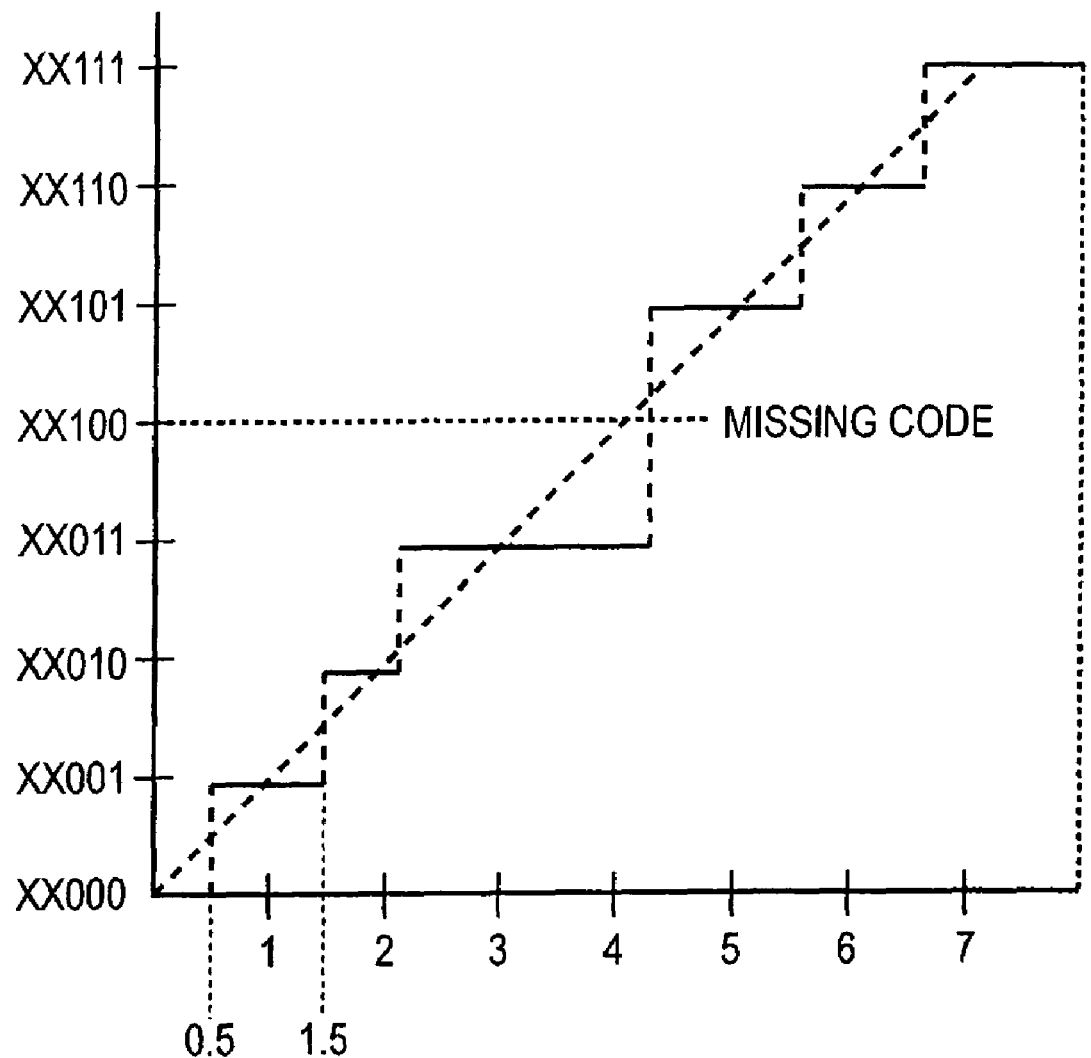
FIG. 1 schematically illustrates an example of differential non-linearity error in an analog to digital converter.

Ideally an analog to digital converter should be linear. Therefore, as shown in FIG. 1 the digital code XX001 (where XX stands for preceding bits whose status is irrelevant to this discussion) spans a input voltage $V_{in}$ from 0.5 to 1.5 arbitrary units. Similarly the range XX010 spans the input voltage from 1.5 to 2.5. Each digital code should span the same distance in the analog domain, namely 1 voltage input unit as shown in FIG. 1. However as shown in FIG. 1 a DNL error occurs and consequently the code XX011 spans the input range from 2.25 to 4.25 rather than 2.5 to 3.5 as it should. This will mean that some input values in the range $V_{in}$ greater than 1.5 and $V_{in}$ less than 2.5 will be converted correctly as XX010 and some input voltages in that range will be converted incorrectly as XX011. In the example shown the code XX100 is missing and the code XX101 spans the range 4 to 5.5. The subsequent codes shown in FIG. 1 span their correct ranges.

Figure 2:
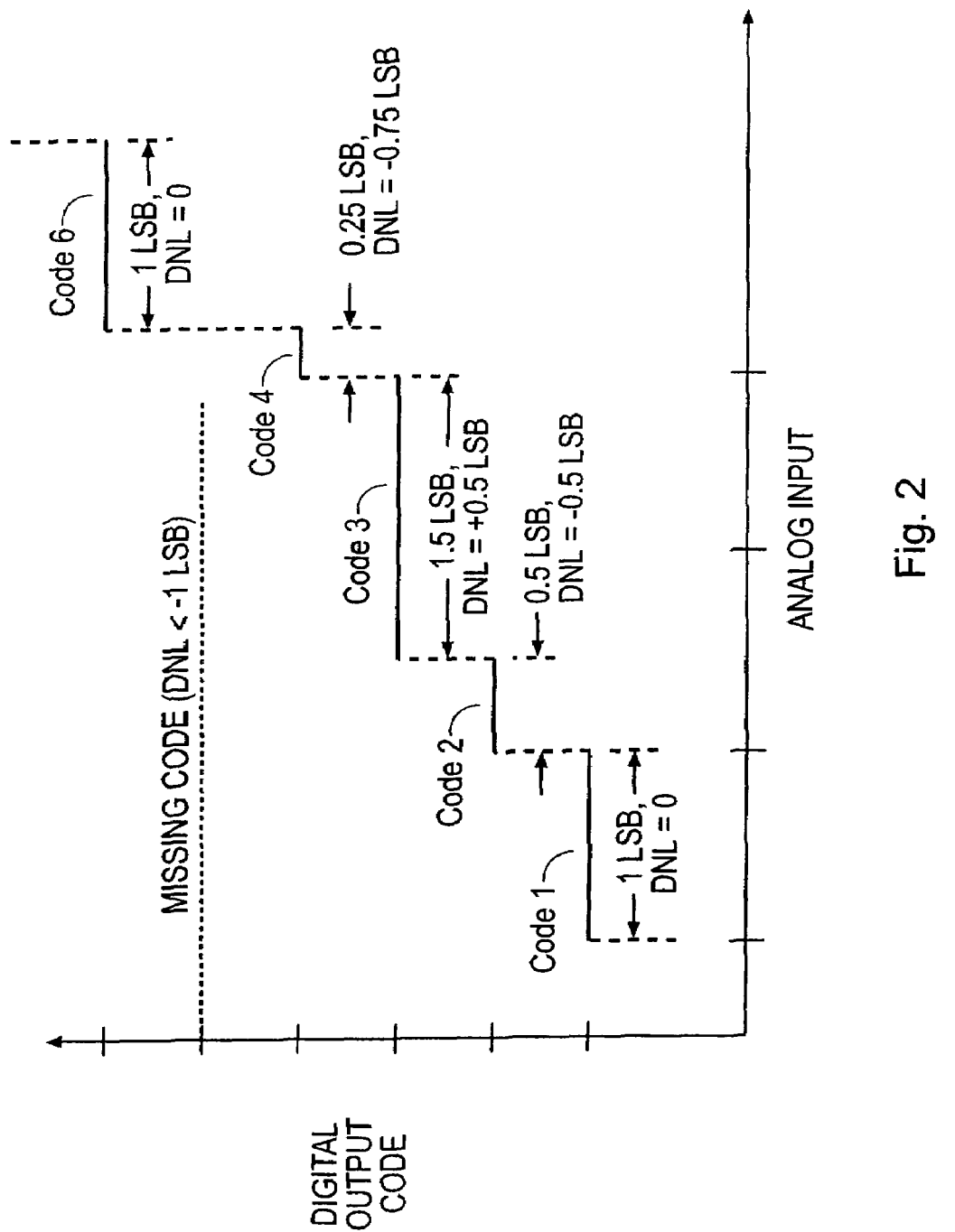
FIG. 2 is a graph illustrating differential non-linearity errors.

It is useful to consider DNL errors a little further. FIG. 2 shows a series of digital output codes versus analog input voltage. In this example the first digital output code, code 1, is assumed to exactly span its correct range of 1 LSB and consequently its DNL error is zero. The next code, code 2, only spans half the analog input voltage range that it should span. It has a DNL of −0.5 LSB. The third code, code 3, spans too great a range an in this example spans a range equivalent to 1.5 LSB so it has a DNL of +0.5 LSB. The fourth code, code 4, only spans a range equivalent to 0.25 LSB so has a DNL of −0.75 LSB. Interestingly the fifth code is missing and the sixth code, code 6, spans the correct distance of 1 LSB in the analog voltage range so its DNL=0, although it will be seen that it is offset from its expected voltage range by 1.75 LSB.

Adding a known dither to the operation of the analog to digital converter can reduce the problems of missing codes and can also improve the differential non-linearity errors. This is because, when converting an fixed input voltage with dither applied, the converted result will be scattered across a plurality of the conversion bins rather than consistently falling into the same one. A prior art solution, as described in U.S. Pat. No. 5,010,339, of sampling the input voltage and then summing it using a summer with a dither voltage prior to sending this to the analog to digital converter increases the complexity of the converter circuit as a whole by requiring the provision of additional analog components. Furthermore the DAC used to generate the analog dither voltage and the summer may be a source of noise, offset and gain error and may therefore degrade other aspects of performance of the analog to digital converter. Even if the components were integrated into an ADC, it is an expensive method of implementing dither functionality in terms of silicon area used and power consumption of the ADC. In addition U.S. Pat. No. 5,010,339 has to take additional precautions to prevent the sum of the input voltage and the dither exceeding the full scale range of the ADC.

The inventors have realised that the switched capacitor architecture used in many successive approximation converters can be used to impose a perturbation or a dither onto the sampled signal. Depending on the configuration of the switched capacitor array, and in particular whether it has error correction capacitors included therein and if so how many, then the present invention may be implemented without modification of the switched capacitor array. However, in some instances the implementation of the present invention can be facilitated by the formation of a plurality of low value (i.e. close to 1 LSB) additional capacitors which can be used as a source of the dither. The formation of additional capacitors is advantageous as the additional capacitors may later be used to improve the signal to noise ratio of the converter by obtaining multiple conversion results, as explained in the applicant's co-pending patent application entitled An Analog to Digital Converter and filed Nov. 3, 2005 as Ser. No. 11/266,071, claiming the benefit of a like-titled provisional application No. 60/708,057 filed on the 12 Aug. 2005, and incorporated herein by reference.

Figure 3:
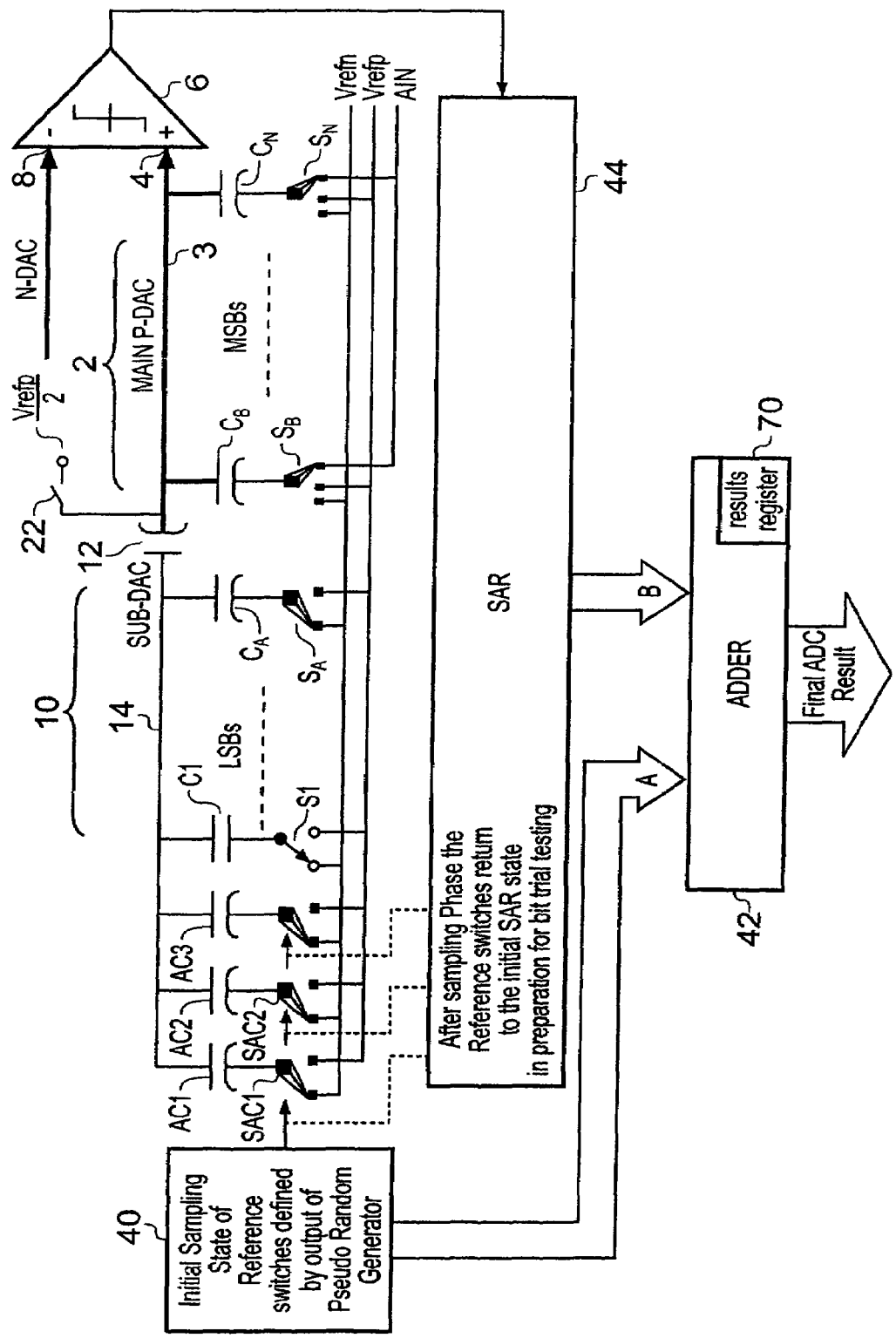
FIG. 3 schematically illustrates an analog to digital converter constituting an embodiment of the present invention.

FIG. 3 schematically illustrates an analog to digital converter constituting an embodiment of the present invention. Typically an analog to digital converter comprises two switched capacitor arrays, one designated "P-DAC" and generally designated 2 and connected to the non-inverting input 4 of a comparator 6. An equivalent switched capacitor array, designated "N-DAC" is connected to the inverting input 8 of the comparator 6. The arrays are identical and, for simplicity, only one need be described. Indeed, the operation of the analog to digital converter can be understood more simply if it is assumed that the "N-DAC" array is omitted and that the inverting input 8 is connected to a reference voltage, for example ground.

In general an N bit converter, for example an 14 bit converter will have 14 binary weighted capacitors fabricated therein. The least significant capacitor, C1, has a capacitance value of 1 arbitrary unit, the next most significant capacitor, C2 has a value of 2 arbitrary units, the next most significant capacitor C3 has a value of 4 units, the next most significant capacitor, C4 has a value of 8 units and so on all the way up to CN (e.g. C14) capacitor which has a value of 8,192 units. This, in practice, represents a very large scaling from the smallest capacitor to the largest capacitor and it is difficult to maintain the scaling accurately over the entire 14 bit range. In order to overcome this problem the switched capacitor array can be implemented as a segmented array. Therefore as shown in FIG. 3 the most significant capacitors are provided in a main or primary array which has been designated 2, and the least significant capacitors are provided in a sub array designated 10. The capacitors within any array have to be binary weighted with respect to one another, but the scaling between arrays can be broken and the correct relative sizes of the capacitors restored by the appropriate sizing of a coupling capacitor 12 which connects the sub array 10 to the main array 2. Thus, considering a 14 bit analog to digital converter the least significant seven capacitors, C1 to CA where A=7 can be placed in the sub array 10, and the most significant capacitors CB to CN where B=8 and N=14 can be placed in the main array 2. Within the sub array 10, the smallest capacitor C1 has a value of 1 arbitrary unit, but the largest capacitor within that array, CA only has a value of 64 arbitrary units. Similarly, within the main array, the smallest capacitor CB has a value of 1 arbitrary unit and the largest capacitor CN has a value of 64 arbitrary units. Therefore the problems of scaling capacitors within any array is significantly reduced and the total area of silicon within an integrated circuit which is required by the capacitor array is also reduced. In the context of a 16 bit converter 8 capacitors will be provided in the sub array 10 and 8 capacitors will be provided in the main array 2. The relative sizes within each array would then only vary by a factor of 1 to 128. The converter designer is not compelled to split the capacitors equally between the sub array 10 and the main array 2 and, for example, the main array 2 may have more capacitors in it than in the sub array 10.

For a 14 bit DAC having no error correction capacitors the relative sizes of the capacitors would be C1=1, C2=2, C3=4, C4=8, C5=16, C6=32, C7=64 coupling capacitor 12=1

C8=1, C9=2, C10=4, C11=8, C12=16, C13=32, C14=64.

where capacitors C1 to C7 are in a sub-array and capacitors C8 to C14 are in the main array.

A similar scheme would apply in a 16 bit ADC, but each array would have an additional 128 unit capacitor.

Each of the capacitors C1 to CN has an associated switch S1 to SA, and SB to SN which is operable to connect a first plate (the lowermost plate of the capacitors as drawn in FIG. 3) to either a first reference voltage "$V_{refp}$" or to a second reference voltage "$V_{refn}$". Generally $V_{refn}$ corresponds to ground. The capacitors CB to CN of the main DAC array 2 can further be connected by the switches SB to SN, respectively, to a signal path "Ain" in order to allow an input voltage to be sampled onto the capacitors CB to CN. During sampling switch 22 is closed so as to connect the second plates of the capacitors (the uppermost ones as shown in FIG. 3) to ground or some other suitable reference voltage such as ½ Vref. Switch 22 is open at all other times. It can be seen that, in a segmented converter of the type shown in FIG. 3, it is not necessary to sample the input voltage onto the capacitors C1 to CA of the sub array 10.

The consequence of only sampling onto the main capacitor array is that a gain error occurs. This can be corrected by adding an extra unit value capacitor to correct for not having sampled onto the sub array. This additional capacitor can be referred to as a sampling capacitor because it is only used in the sampling phase and has an equivalent bit weight, as set out below, equal to the sum of the capacitor bit weights in the sub array plus one LSB (excluding error correction bits if present in the sub array.

So in a 16 bit ADC we have:

| BIT no. | SUB capacitor Array | | | | | | | | | MAIN capacitor array | | | | | | | |
|---|---|---|---|---|---|---|---|---|---|---|---|---|---|---|---|---|---|
| Capacitor no | 1 | 2 | 3 | 4 | 5 | 6 | 7 | 8 | CC | SC | 9 | 10 | 11 | 12 | 13 | 14 | 15 | 16 |
| # of physical unit cap's | 1 | 2 | 4 | 8 | 16 | 32 | 64 | 128 | 1 | 1 | 1 | 2 | 4 | 8 | 16 | 32 | 64 | 128 |
| Capacitor bit weight | 1 | 2 | 4 | 8 | 16 | 32 | 64 | 128 | | 256 | 256 | 512 | 1024 | 2048 | 4096 | 8192 | 16384 | 32768 |

Where
CC = coupling capacitor
SC = sampling capacitor

Once the input voltage $A_{in}$ has been sampled onto capacitors CB to CN the switch 22 is opened thereby capturing the charge on the capacitors of the main array 2. A successive approximation search can then be commenced. The successive approximation search strategy is well known to the person skilled in the art and hence it need be only given the briefest mention here. In essence, all the switches S0 to SN are switched to connect to the capacitors to the $V_{refn}$ reference voltage. Next the most significant capacitor CN is tested and its switch SN is used to connect it to the voltage reference $V_{refp}$. The capacitors of the array effectively form a capacitive potential divider and consequently a voltage occurring at the non-inverting input 4 changes. The comparator 6 tests to see whether the voltage is greater or less than the voltage at its inverting input. Depending on the results of the comparison the bit corresponding to capacitor CN is either kept (that is set) or discarded (reset). If the analog value being converted is in the upper half of the conversion range then the bit CN will be kept otherwise it will be discarded. The result of the first bit trial is carried forward to the next most significant bit trial C(N−1) which is set and tested in a similar way and the results are then carried forward again all the way through the successive approximation search until the final bit C1 has been tested.

In order to enhance performance and increase the overall conversion speed of the analog to digital converter it is known to fabricate additional error correction capacitors within the arrays. These capacitors provide extra "weights" within the array and allow the successive approximation search to recover from incorrect decisions and as a consequence allows the settling time between switching the switches S1 to SN and capturing the decision from the comparator 6 to be considerably reduced.

Modern Analog to digital converters frequently include error correction capacitors to allow recovery from incorrect decisions. In an example of the present invention the effective weights of the capacitors (as accounted for by rescaling in the sub array 10) follow the pattern;

32768, 16384, 8192, 4096, 2048, ±1024, 1024, 512, 256, 128, ±64, 64, 32, 16, 8, ±4, 4, 2, ±1, ±1, 1, ±0.5, ±0.5, ±0.5, ±0.5, ±0.5, ±0.5, ±0.5.

In this preferred embodiment seven additional capacitors AC1 to AC7 having weights of ±0.5 are fabricated of which for simplicity only 3 capacitors AC1 to AC3 are shown in FIG. 3.

The seven additional capacitors AC1 to AC7 in the preferred embodiment are re-used in another process to improve the signal to noise ratio of the analog to digital converter, which process does not constitute part of the present invention. Therefore, for simplicity we need only assume that one capacitor AC1 need be provided in the P-DAC array and that this additional ½ LSB capacitor need only have a value of 0.5 LSB.

The formation of the error correction capacitors having, for example, a value of ±1024 is well known to the person skilled in the art. In a preferred embodiment the capacitor having the value ±1024 consists of two capacitors each having a weight of 1024 bits. The analog input is not sampled onto these capacitors. During the sampling phase the first of these capacitors is connected to $V_{refp}$ and the second capacitor is connected to $V_{refn}$. During the bit trial the second of these capacitors is disconnected from $V_{refn}$ and connected to $V_{refp}$ to test a weight of +1024. If the bit is accepted then both the first and second of the capacitors remain connected to $V_{refp}$. If the bit is rejected, then both the first and second capacitors are disconnected from $V_{refp}$ and connected to $V_{refn}$ generating a negative step of −1024 LSBs.

As noted before, during the sampling phase the capacitors C1 to CA have their first plates (the lowermost plates shown in FIG. 3) connected to $V_{refn}$ on the P-DAC. The corresponding capacitors in the N-DAC (not shown in detail in FIG. 3) are connected to $V_{refp}$ via their respective electronically controllable switches. It should be noted that it is not necessary to connect the first plates of the capacitors in the sub array to any specific reference voltage as we are only interested in the change in charge that propagates through the coupling capacitor 12 from the sub array 10 to the main array 2.

The inventors have realised that a dither can be introduced into the analog to digital converter by modifying the switch positions during sampling such that some of the lower capacitor bit weights in the P-DAC sub array 10 have their first plates connected to $V_{refp}$ during the sampling phase rather than being connected to $V_{refn}$. When the switches are connected back to $V_{refn}$ at some time during the successive approximation conversion process and preferably, though not necessarily, before the most significant bit CN is tested a charge redistribution occurs which creates a negative perturbation to the voltage at the common rail 14 of the sub-DAC 10 which in turn causes a negative perturbation to be introduced into the main array 2 via the coupling capacitor 12 thereby causing a slight but known change in the voltage sampled on to the main array 2. Applying the same dither technique to the N-DAC sub array will produce a positive perturbation to the sampled input. The dither can be introduced by altering the switches S1 to SA of any of the capacitors C1 to CA of the sub array although in general it is preferable for the dither to be kept small. It can therefore be seen that selective switching of capacitors within the sub capacitor array can be used to perturb the voltage that was sampled onto the main capacitor array during the sampling phase and hence introduce a positive or negative dither into the analog to digital converter without complicating the analog signal path within the converter.

As noted above, it is preferable that the dither be resolvable to 0.5 LSB. Therefore it is desirable to form one additional capacitor, AC1, having a value of 0.5 LSB. Such a capacitor can be formed by connecting two unit (1 LSB) to capacitors in series. This additional capacitor AC1 may then be used in conjunction with a few of the lower value capacitors, for example C1 and C2 of the sub array in order to add a dither ranging between 0 and −3.5 LSB to the sub array 10. Similarly the capacitors in the sub array of the N-DAC can be used to add a dither ranging between 0 to +3.5 LSB.

Where, as shown in FIG. 3, multiple additional capacitors AC1 to AC3 are provided then these may be used either exclusively, or in addition to the lower weight capacitors of the sub DAC in order to implement the dither functionality. In an embodiment of the present invention seven additional capacitors AC1 to AC7 each having a value of 0.5 LSB are implemented in the sub DAC. For convenience the first of the additional capacitors AC1 is switched individually so as to form a 0.5 LSB dither capacitor. Two of the capacitors, AC2 and AC3 are switched in unison so as to synthesise a 1 LSB dither capacitor, and the remaining capacitors AC4 to AC7 are switched in unison so as to synthesise a 2 LSB dither capacitor. The switches SAC1, SAC2 and so on are driven in response to a pseudo random number generated by the pseudo random number generator 40. This randomly produces a number between −7 and 7, inclusive, in order to control the switches in the sub DAC 10 associated with the P-DAC and the corresponding switches in the sub DAC (not shown) associated with the N-DAC.

For those embodiments with only one additional capacitor AC1, the pseudorandom generator 40 controls the switches SAC1, S1, S2, S3 and so on. Thus to introduce a negative dither value of −5 LSB switches S1 and S3 would be connected to $V_{refp}$ and S2 is connected to $V_{refn}$ on the P-DAC sub array as shown in FIG. 3, and the similar switches on the N-DAC sub array (omitted for clarity in FIG. 3) are connected to $V_{refp}$ during the sampling phase. Once the sample phase has been completed the switch 22 is opened followed by switches SB to SN which disconnect the first plates of the capacitors CB to CN from the analog input signal. The switches SB to SN can then be set to an initial successive approximation state in preparation for the most significant bit bit trial. As noted before, when the switches S1 and S3 are connected back to $V_{refn}$ a negative perturbation is introduced onto the sampled voltage on the main array 2.

For those embodiments having the additional capacitors, for example AC1 to AC7 similar considerations apply although due to scaling a pseudorandom number of −5 would in this instance operate the switches associated with the 0.5 LSB capacitor, AC1, and the composite 2 LSB capacitor formed by capacitors AC4 to AC7 to introduce a dither of −2.5 LSB.

In either case, the bit trial is performed to its end and the result of the successive approximation conversion is passed to the adder 42 by the successive approximation controller 44. The adder then corrects the result to account for the size of the dither that was applied to the sampled signal after the sampling had been completed.

It is also apparent that, during sampling all of the capacitors may be connected to the same reference voltage, and that once the sampling phase has been completed, some of the capacitors are switched in response to the pseudo-random number generator. The switching can be done before the bit trials commence or during the bit trials.

Furthermore, since the sampled charge is not lost from the capacitor array, one sampling event may be followed by more than one conversion, either fully, or just partially reconverting some of the least significant bits and a different dither can be applied for each of these conversions even though they are related to only a single sampling event.

It can therefore be seen that the present invention enables a dither to be applied to a sampled voltage without introducing any additional components into the analog signal path. Furthermore the dither can be applied without fabricating any additional components within the analog to digital converter. However, in some implementations of the invention additional capacitors may be fabricated within the sub array as these may conveniently be used to apply dithers of less than 1 LSB.

Where additional capacitors are fabricated, it is possible to provide sub LSB capacitances quite easily. Although in the examples given the smallest capacitance fabricated has been 0.5 LSB, smaller capacitances can be fabricated easily using the unit size capacitors that are laid down during fabrication of an analog to digital converter. Thus a ⅓ LSB capacitor can be fabricated by connecting three unit capacitors in series. Similarly a ¼ LSB can be fabricated by connecting four unit capacitors in series, a ⅕ can be fabricated by connecting five unit capacitors in series and so on. From this, it could be seen that dither can easily depart from the nominally binary weighted sequence of capacitor values.

As noted before, the dither capacitors do not necessarily have to be additional capacitors but could be selected from capacitors of the sample and convert switched capacitor array. Furthermore, although this technique has been described with respect to a segmented ADC, it can equally be applied to non-segmented arrays. It is thus possible to correct for DNL errors using either existing capacitors in the array or by merely adding a few extra capacitors. This provides an inexpensive solution with low power consumption and good compatibility with the ADC design.

The invention claimed is:

1. An analog to digital converter for converting an analog input signal to a digital output signal, comprising a first group of capacitors for participation in a successive approximation conversion, each capacitor having at least one associated switch for controllably connecting a terminal of the capacitor to a first reference voltage or to a second reference voltage; a second group of capacitors for applying a dither and having switches for selectively connecting the capacitors to the first reference voltage or the second reference voltage and a sequence generator for generating a sequence of bits, wherein during sampling of the analog input signal onto at least some of the capacitors of the first group of capacitors or during conversion of a sample of the analog input signal an output of the sequence generator is supplied to the switches of the second group of capacitors to control whether a given capacitor within the second group is connected by its associated switch to the first reference voltage or to the second reference voltage, so as to apply a dither to said conversion.

2. An analog to digital converter as claimed in claim 1, in which some of the capacitors of the first group of capacitors have switches that are operable to connect the capacitors to the input during sampling.

3. An analog to digital converter as claimed in claim 2, in which, following sampling of the input signal onto the first group of capacitors, the capacitors in the second group are switched to a predetermined state.

4. An analog to digital converter as claimed in claim 3, in which following sampling the capacitors in the second group are connected to the second reference voltage.

5. An analog to digital converter as claimed in claim 1, in which the second group of capacitors have a total capacitance which represents less than 1% of the capacitance of the array of capacitors.

6. An analog to digital converter as claimed in claim 1, in which the second group of capacitors are part of a sub array of capacitors connected to a primary array of capacitors via a coupling capacitor.

7. An analog to digital converter as claimed in claim 1, in which the capacitors in the array are nominally binary weighted.

8. An analog to digital converter as claimed in claim 1, in which the capacitor array includes error correction bits.

9. An analog to digital converter as claimed in claim 1, in which the sequence generator generates a pseudorandom bit sequence.

10. An analog to digital converter as claimed in claim 1, in which an adder receives the converted result from the converter and the output of the sequence generator and applies a correction based on the output of the sequence generator.

11. An analog to digital converter as claimed in claim 1, further comprising at least one capacitor within the second group having a value of less than 1 LSB.

12. An analog to digital converter as claimed in claim 1, comprising a P-DAC connected to a non-inverting input of a comparator and an N-DAC connected to an inverting input of a comparator, where at least one of the N-DAC and P-DAC have a second group of capacitors therein whose switches are responsive to the sequence generator.

13. An analog to digital converter as claimed in claim 1 in which the dither is sometimes additive and sometimes subtractive.

14. An analog to digital converter as claimed in claim 1, in which the second group of capacitors are switched to a dither value during sampling of the signal and are switched to a further value after sampling is complete so as to apply a dither to the sampled value.

15. An analog to digital converter as claimed in claim 1, in which the second group of capacitors are switched to a dither value after sampling is complete so as to apply a dither to the sampled value.

16. An analog to digital converter, comprising
a switched capacitor array for use in sampling an input signal and for converting a sample of said input signal to a digital value; and
a switched capacitor digital to analog converter responsive to a control word, wherein after sampling an input signal onto the switched capacitor array to store charge in said array, the switched capacitor digital to analog converter is operated to make a known perturbation to the charge stored on the switched capacitor array.

17. An analog to digital converter as claimed in claim 16, in which the switched capacitor digital to analog converter is an integral part of the switched capacitor array.

18. An analog to digital converter as claimed in claim 16, in which the digital to analog converter is set to a dither value during sampling of the signal, and the capacitors are then switched to a further value after sampling is complete so as to apply the dither to the sampled value.

19. An analog to digital converter as claimed in claim 16, in which the digital to analog converter is set to a dither value after sampling is complete so as to apply the dither.

20. A method of applying a dither to an analog to digital converter, wherein the converter comprises an a first group of capacitors, each capacitor having at least one associated switch for controllably connecting a terminal of the capacitor to a first reference voltage or to a second reference voltage, the method comprising supplying a perturbation control word to the switches of a group of capacitors during sampling of a signal onto at least one capacitor of the array of capacitors or during conversion so as to control whether a given capacitor within the group is connected by its associated switch to the first reference voltage or to the second reference voltage, and wherein the capacitors of the first group are bit-trialled by a successive approximation controller to obtain a digital value.

21. A method as claimed in claim 20, in which the perturbation control word changes randomly or pseudo randomly from one sample to the next.

22. A method of adding dither to an input signal to be digitized by an analog to digital converter, wherein the analog to digital converter comprises a switched capacitor array for use in sampling an input value and for converting the input value to a digital value, and the analog to digital converter further comprises a switched capacitor digital to analog converter responsive to a control word, wherein after sampling an input signal onto the switched capacitor array the switched capacitor digital to analog converter is operated to make a known perturbation to the charge stored on the switched capacitor array or to the voltage occurring on the array.

23. A segmented analog to digital converter as claimed in claim 22, in which the dither can be subtracted from the sampled value.

24. A segmented analog to digital converter having an array of capacitors divided into a main array and a sub array, and where the capacitors are connectable to either a first reference voltage or a second reference voltage, and wherein the capacitors of the main array are further connectable to an input signal and store the input signal, and a sequence generator for generating a dither word used to control whether at least one of the capacitors of the sub array are connected to the first reference voltage or the second reference voltage so as to apply a dither to the conversion result.

25. A segmented analog to digital converter as claimed in claim 24, in which the capacitors used to apply the dither are not varied during a successive approximation conversion.

* * * * *